(12) United States Patent
Furuta

(10) Patent No.: US 7,561,390 B2
(45) Date of Patent: Jul. 14, 2009

(54) PROTECTION CIRCUIT IN SEMICONDUCTOR CIRCUIT DEVICE COMPRISING A PLURALITY OF CHIPS

(75) Inventor: Hiroshi Furuta, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 279 days.

(21) Appl. No.: 11/074,052

(22) Filed: Mar. 8, 2005

(65) Prior Publication Data
US 2005/0201031 A1    Sep. 15, 2005

(30) Foreign Application Priority Data
Mar. 10, 2004   (JP)   ............... 2004-068082

(51) Int. Cl.
*H02H 7/00*   (2006.01)
(52) U.S. Cl. ......................... 361/56; 361/111
(58) Field of Classification Search .............. 361/56, 361/91.1, 111, 118, 719–721; 257/778, 787, 257/296
See application file for complete search history.

(56) References Cited

U.S. PATENT DOCUMENTS

| | | | |
|---|---|---|---|
| 5,703,747 A | 12/1997 | Voldman et al. | |
| 5,886,558 A | 3/1999 | Iijima | |
| 5,901,022 A | 5/1999 | Ker | |
| 6,078,514 A | 6/2000 | Takemae et al. | |
| 6,191,633 B1 | 2/2001 | Fujii et al. | |
| 6,329,863 B1 * | 12/2001 | Lee et al. | 327/309 |
| 6,507,117 B1 * | 1/2003 | Hikita et al. | 257/778 |
| 7,076,757 B2 * | 7/2006 | Hirata | 716/10 |
| 2003/0155635 A1 * | 8/2003 | Ishiyama | 257/666 |
| 2004/0150424 A1 * | 8/2004 | Wuppermann | 326/80 |

FOREIGN PATENT DOCUMENTS

| | | |
|---|---|---|
| JP | 09-172146 | 6/1997 |
| JP | 11-086546 | 3/1999 |
| JP | 11-150236 | 6/1999 |

OTHER PUBLICATIONS

J. Lee et al., "Chip-Level Charged-Device Modeling and Simulation in CMOS Integrated Circuits," IEEE Transactions on Computer-aided Design of Integrated Circuits and Systems, vol. 22, No. 1, Jan. 2003, pp. 67-81.

* cited by examiner

*Primary Examiner*—Stephen W Jackson
*Assistant Examiner*—Terrence R Willoughby
(74) *Attorney, Agent, or Firm*—Foley & Lardner LLP

(57) ABSTRACT

A multichip package according to an embodiment of the invention comprises a first chip and a second chip. A first ground line formed in the first chip and the second ground line formed in the second chip are connected via ESD protection circuits. One of the protection circuits is formed in the first chip and the other is formed in the second chip, allowing effective ESD discharge according to CDM model.

20 Claims, 7 Drawing Sheets

PROTECTION CIRCUIT IN SEMICONDUCTOR CIRCUIT DEVICE COMPRISING A PLURALITY OF CHIPS

BACKGROUND OF THE INVENTION

1. Field of the Invention

The present invention relates to a semiconductor circuit device comprising a plurality of semiconductor circuit chips, and more particularly, to ESD protection in a semiconductor circuit device comprising semiconductor circuit chips.

2. Description of Related Art

A surge voltage or surge current applied to a circuit causes electrostatic damage to elements in the circuit. A sudden flow of electric charge which causes electrostatic damage of elements in this way is known as "ESD" (Electro Static Discharge). In particular, one of the key points in the design of CMOS circuits, or the like, which have remarkably compact element size, is to protect the MOSFET gates from damage caused by ESD. Several models relating to the behavior of ESD are known, which are used in the design of ESD protection circuits for protecting elements from ESD. The principal models are the HMB (Human Body Model), MM (Machine Model), and CDM (Charged Device Model). These ESD models are described in U.S. Pat. No. 5,901,022.

The HMB model is a model which analyzes ESD charge applied directly from a human body, and the MM model is a model which analyzes ESD charge applied to a chip from an object charged with electric charges. Consequently, in the HMB model and the MM model, ESD charges applied from external terminals flow into the internal circuit of the chip. In these models, the ESD protection circuit is designed and installed so that it suppresses the flow of ESD charge from external terminals (the input/output terminals) into the internal circuitry.

On the other hand, the CDM model analyzes the ESD between a charged device (package) and other conductors. The CDM phenomenon is created by the discharge of an electric charge from a device (or package) in a charged state to an earthed conductors or other metal. Element damage may occur as the charge passes through the device during this discharge. FIG. 9 is a diagram illustrating ESD in a CDM model and a related ESD protection circuit.

Here, an example case is described in which charges are discharged from an external terminal 902 of a chip (a P type substrate 901 in the diagram) charged to a negative voltage $V_{ESD}$. When the input pad 902 is grounded, an ESD current $I_{ESD}$ flows through the circuit and is discharged to ground via the input pad 902. In FIG. 9, one path is indicated for the ESD current. The charges accumulated in the P type substrate 901 flow into the ground line (GND) 904. The ESD protection circuit 905 functions and the ESD current flows from the ground line 904 through the ESD protection circuit 905 to the input signal line 906, and it then flows into ground via the input pad 902. By means of the effective functioning of the protection circuit 905, it is possible to prevent electrostatic damage to the gate insulation film of the CMOS 903. However, depending on the capacity of the protection circuit 905, the gate potential of the MOSFET in the CMOS circuit 903 may reach ground level earlier and the gate insulation film breakdown may occur due to a large potential difference with respect to the substrate.

Various specifications are known relating to the configuration of ESD protection circuits and the connection position of protection circuits. For example, Japanese Patent Laid-open No. 09-172146 discloses an integrated semiconductor circuit comprising an MIS transistor as the transistor gate, in which destruction of the gate insulation film of a transfer gate is prevented in a device charge model test by a clamping element connected to the transfer gate. Alternatively, Japanese Patent Laid-open No. 11-150236 proposes a technique for an integrated semiconductor circuit comprising two or more types of power supply, in which an ESD protection element is inserted, in various configurations, between a high-potential power supply line (power supply line) and a low-potential power supply line (ground line), in order to prevent electrostatic damage to the element.

In the circuit disclosed in Japanese Patent Laid-open No. 11-150236, in a circuit comprising a first and second power supply systems, a first high-potential power supply and a second high-potential power supply line are separated from each other, and a first low-potential power supply line and a second low-potential power supply line are connected via a protection circuit. Thereby, element damage in a second circuit caused by the increase in the potential of the first low-potential side power supply line is prevented. Additionally, it is proposed, for instance, to connect a high-potential power line and a low-potential power line belonging to different power supply systems via a protection element, or to connect a protection element between the signal line and the ground line between a first power supply system and a second power supply system.

Recently, there have been increasing demands for further reductions to be achieved in the size, thickness and weight of digital equipment, especially portable digital equipment, such as portable telephones, PDA (Personal Digital Assistant) devices, and remarkable progress has been made in this respect. Moreover, in such portable digital equipment, for example, with the increase of communications data, such as email and images, it has become necessary to increase the capacity of the memory devices used, or to adopt multifunction memories. A known technique which satisfies these requirements is a multichip package in which a plurality of chips are mounted in one package. By mounting a plurality of chips in one package in this way, installation density inside the device is increased and the external dimensions of the package can be reduced.

Typically, a multichip package comprises a plurality of chips which are stacked (arranged in a layered fashion) inside a single package. The plurality of chips are arranged so that the main surfaces of the chips are facing each other, and these main surfaces are connected together by means of connection bumps in order to transmit signals or fixed electric potentials between the chips. A plurality of external terminals are formed on the outer side of the package for connecting to external circuits, and the plurality of external terminals are connected to one or a plurality of the internal chips. Consequently, the external terminals and the internal circuits of the chips are connected, either directly or via other internal chip circuits.

The design of the ESD protection is not limited to circuit designs contained within a single chip, but is also very important in the case of multichip packages, where signals or fixed potentials (ground potential, power supply potential, or the like) are input and output between a plurality of chips as described above. For example, Japanese Patent Laid-open No. 11-086546 discloses a multichip package in which an ESD protection circuit is provided to the connection pad between chips. Furthermore, it also proposes that the current drive capacity of the protection circuit provided to the connection pad between chips be less than that of a protection circuit connected to the external pad. Thereby, it is possible limit the increase of circuit surface area due to a protection circuit between chips or the signal transmission speed reduction due to parasitic capacitance.

Alternatively, U.S. Pat. No. 5,703,747 discloses a multichip semiconductor structure having a chip-to-chip discharge protection network, whereby a three-dimensional multichip package is protected from electrostatic discharges, or other excessive voltages which may cause damage, occurring during the manufacture or subsequent handling and testing of the multichip package. The chip-to-chip discharge suppression network provides an electrical connection between the power planes of the semiconductor device chips in the structure. This, together with a conventional in-chip discharge suppression network located at the external connection points or the input/output pins of the individual chips in the structure, provides protection from discharges between power planes, between an external connection point and a power plane, or between external connection points, such as electrostatic discharges occurring during handling and testing of the structure, or the like. The chip-to-chip discharge suppression network can be provided on an end layer or an end semiconductor chip of the three-dimensional semiconductor structure, and connected to the individual chips in the structure via the edge surface metallization.

A chip-level CDM model and simulation for a CMOS integrated circuit device are disclosed in "Chip-Level Charged-Device Modeling and Simulation in CMOS Integrated Circuits" J. Lee et. al., IEEE TRANSACTION ON COMPUTER-AIDED DESIGN OF INTEGRATED CIRCUITS AND SYSTEMS, VOL. 22, NO. 1, JANUARY 2003, pp. 67-81.

It has now discovered that, in the conventional techniques described above, however, there is no description relating to the charge transfer between chips, and no basic approach is disclosed with regard to the method for installing protection elements for ESD current between chips. Protecting an element effectively against ESD passing over different chips requires a approach different from a protection circuit formed on a single substrate. If the electric charge accumulated in one chip is discharged via another chip, as ESD according to the CDM model, then it is necessary to provide a circuit structure which effectively makes the ESD charge flow between chips having different substrates, or which effectively removes the ESD charge from the chip.

SUMMARY OF THE INVENTION

According to an aspect of the invention, there is provided a semiconductor circuit device comprising a first semiconductor circuit chip, a second semiconductor circuit chip, a first potential supply line formed in the first semiconductor circuit chip, a second potential supply line formed in the second semiconductor circuit chip, a first protection circuit formed in the first semiconductor circuit chip and connecting the first potential supply line and the second potential supply line, a second protection circuit formed in the second semiconductor circuit chip and connecting the first potential supply line and the second potential supply line. A protection circuit provided on each chip affords effective removal of the ESD charge.

According to another aspect of the invention, there is provided a semiconductor circuit device comprising, a first semiconductor circuit chip, a second semiconductor circuit chip, a first potential supply line formed in the first semiconductor circuit chip, a second potential supply line formed in the second semiconductor circuit chip, a third potential supply line formed in the second semiconductor circuit chip and connected to the first potential supply line through a chip-to-chip connection part, a fourth potential supply line formed in the first semiconductor circuit chip and connected to the second potential supply line through a chip-to-chip connection part, a first protection circuit formed in the first semiconductor circuit chip and connected between the first potential supply line and the fourth potential supply line, and a second protection circuit formed in the second semiconductor circuit chip and connected between the second potential supply line and the third potential supply line. The first and second protection circuit prevent the insulator breakdown of elements in the semiconductor circuit device comprising a plurality of chips connected each other.

According to further aspect of the invention, there is provided a semiconductor circuit device comprising, a first semiconductor circuit chip, a second semiconductor circuit chip, a plurality of connection terminals connecting the first semiconductor circuit chip and the second semiconductor circuit chip, comprising a plurality of substrate potential connection terminals and another terminal interposed between the substrate potential connection terminals. Thereby, it is possible to remove ESD charge from the chips uniformly. Here, all the substrate potential connection terminals formed between the chips are not necessarily included in the above feature.

According to yet another aspect of the invention, there is provided a semiconductor circuit device comprising, a first semiconductor circuit chip connected to an external terminal, a second semiconductor circuit chip, a plurality of connection terminals connecting the first semiconductor circuit chip and the second semiconductor circuit chip, comprising a first and a second substrate potential connection terminals, line length from the external terminal to the first substrate potential connection terminal being substantially the same with line length from the external terminal to the second substrate potential connection terminal. Thereby, it is possible to remove ESD charge uniformly from the two substrate potential connection terminal.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

First Embodiment

Figure 1:
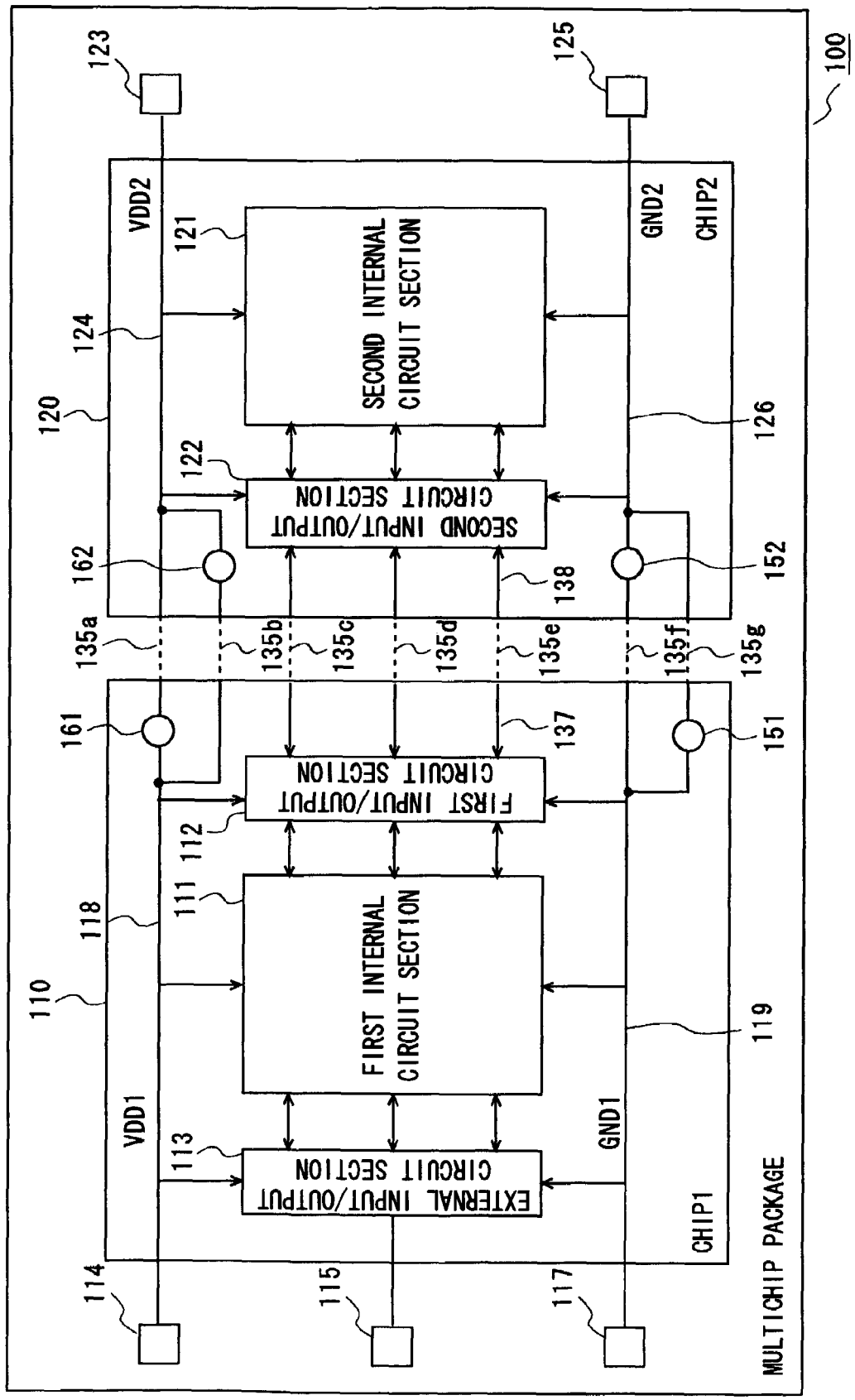
FIG. 1 is a block diagram showing the general circuit configuration of a multichip package according to a first embodiment of the invention.

FIG. 1 is a circuit block diagram showing a general view of the circuit configuration of a semiconductor integrated circuit device according to the first embodiment. In this embodiment, a multichip package in which a plurality of chips are mounted in a single package is described as one example of an integrated semiconductor device. In the multichip package 100, the respective chips are stacked together or they are disposed in parallel in the same plane. Unless specifically stated otherwise, the circuit configuration described in this specification may be applied to a multichip package of any layout configuration.

In FIG. 1, the multichip package 100 comprises a first integrated semiconductor circuit chip 110 and a second integrated semiconductor circuit chip 120. In this example, two chips are illustrated, but the multichip package 100 may of course comprise three or more chips. In the multichip package 100 according to the present embodiment, in order to prevent the electrical potential variations in one chip from degrading the characteristics of the other chip, a separate power supply pad and ground pad are provided respectively at the first chip and the second chip. Furthermore, a power supply line and a ground line connected to the respective pads are provided inside each of the chips 110 and 120, respectively. The present invention may also be applied to a case where an electric potential equal to the power supply or to ground of the chips is supplied.

The configuration of the circuit in FIG. 1 will now be described. The first chip 110 comprises a first internal circuit section 111, a first input/output circuit section 112 for exchanging signals with the second chip 120, and an external input/output circuit section 113 for exchanging signals with an external circuit. Numeral 114 denotes a first power supply pad to which a first power supply potential (VDD1) is supplied from a power supply located outside the circuit. Numeral 115 denotes an input/output pad which receives or puts out signals from or to an external circuit. Numeral 117 denotes a first ground pad which is connected to a ground circuit section located outside the circuit and which is supplied with a first ground potential (GND1).

Numeral 118 is a first power supply line, which is an example of a fixed-potential supply line supplying a fixed potential. The first power supply line 118 is connected to the first power supply pad 114 and it supplies the power supply potential supplied through the first power supply pad 114. The first power supply line 118 is connected to the first internal circuit section 111, the first input/output circuit section 112 and the external input/output circuit section 113, and it supplies the first power supply potential (VDD1) respectively to these sections. Numeral 119 denotes a first ground line, which is another example of a fixed-potential supply line that is connected to the first ground pad 117 and supplies ground potential to each of the circuits inside the first chip 110. The first ground line 119 is connected to the first internal circuit section 111, the first input/output circuit section 112, and the external input/output circuit section 113, and it supplies the necessary ground potential to each of these sections.

The second chip 120 comprises a second internal circuit section 121 and a second input/output circuit section 122 which exchanges signals with the first chip 110. The second input/output circuit section 122 exchanges signals with the first input/output circuit section 112, via a connection pad (not illustrated). The input/output circuit sections 112, 122 may also be configured in such a manner that they only have an input circuit or an output circuit. Numeral 123 denotes a second power supply pad to which a second power supply potential (VDD2) is supplied from a power supply located outside the circuit. Numeral 124 denotes a second power supply line, which is a further example of a fixed-potential supply line, that is connected to the second power supply pad 123 and supplies the power supply potential supplied via the second power supply pad 123.

The second internal circuit section 121 and the second input/output circuit section 122 are connected to the second power supply line 124 and are supplied with the second power supply potential (VDD2). Numeral 125 denotes a second ground pad which is connected to the ground located outside the circuit and is supplied with a second ground potential (GND2). Numeral 126 denotes a second ground line, which is a further example of a fixed-potential supply line that is connected to the second ground pad 125 and supplies the ground potential to the respective circuits of the second chip 120. The second internal circuit section 121 and the second input/output circuit section 122 are connected to the second ground line 126 and are thus supplied with the necessary ground potential (GND2). The two power supply potentials may be the same or they may be different. The ground potential is set to a lower potential than the power supply potentials, and the value of the ground potentials are determined appropriately, depending on the design. The two ground potentials may be the same or different, depending on the circuit design.

The circuits of the first chip 110 and the second chip 120 are circuitry connected by a plurality of chip-to-chip connecting sections 135. Each chip-to-chip connecting section 135a-135g provides a mutual connection between the signal lines 137 and 138, the power supply lines 118 and 124, or the ground lines 119 and 126, formed on the first chip 110 and the second chip 120, thereby allowing input/output signals or a power supply potential or ground potential to be transmitted between the chips. The chip-to-chip connecting sections 135a-135g can be formed by connection pads or connection wires, for example.

The ESD (Electro Static Discharge) protection circuits 151 and 152 are connected between the first ground line 119 and the second ground line 126, and the first ground line 119 and the second ground line 126 are connected via the ESD protection circuits 151 and 152. The protection circuits 151 and 152 have a function to connect electrically the ground lines to pass the surge current when the voltage between the ground lines is greater than a prescribed value. In general, an ESD protection circuit is able to prevent breakdown of the gate insulation film of the element due to overvoltage by clamping the lines to a prescribed clamping voltage. Furthermore, ESD protection circuits 161 and 162 are connected between the first power supply line 118 and the second power supply line 124, and the first power supply line 118 and the second power supply line 124 are connected via these ESD protection circuits 161 and 162. In the integrated semiconductor circuit device 100 according to the present embodiment, protection circuits are formed respectively in the first chip 110 and the second chip 120. As shown in FIG. 1, the first chip 110 comprises protection circuits 151 and 161, and the second chip 120 comprises protection circuits 152 and 162. Preferably, the protection circuits 151 and 152 and the protection circuits 161 and 162 are connected in a parallel circuit configuration between the ground lines or between the power supply lines. As shown in FIG. 1, the power supply lines 118 and 124 are connected together by means of two branched paths. One path includes the ESD protection circuit 161 and the chip-to-chip connecting section 135*a*. The other path includes the ESD protection circuit 162 and the chip-to-chip connecting section 135*b*. Similarly, two branched paths are connected between the ground lines 119 and 126. One path includes the ESD protection circuit 151 and the chip-to-chip connecting section 135*g*. The other path includes the ESD protection circuit 152 and the chip-to-chip connecting section 135*f*. These points will be discussed further below.

Figure 2:
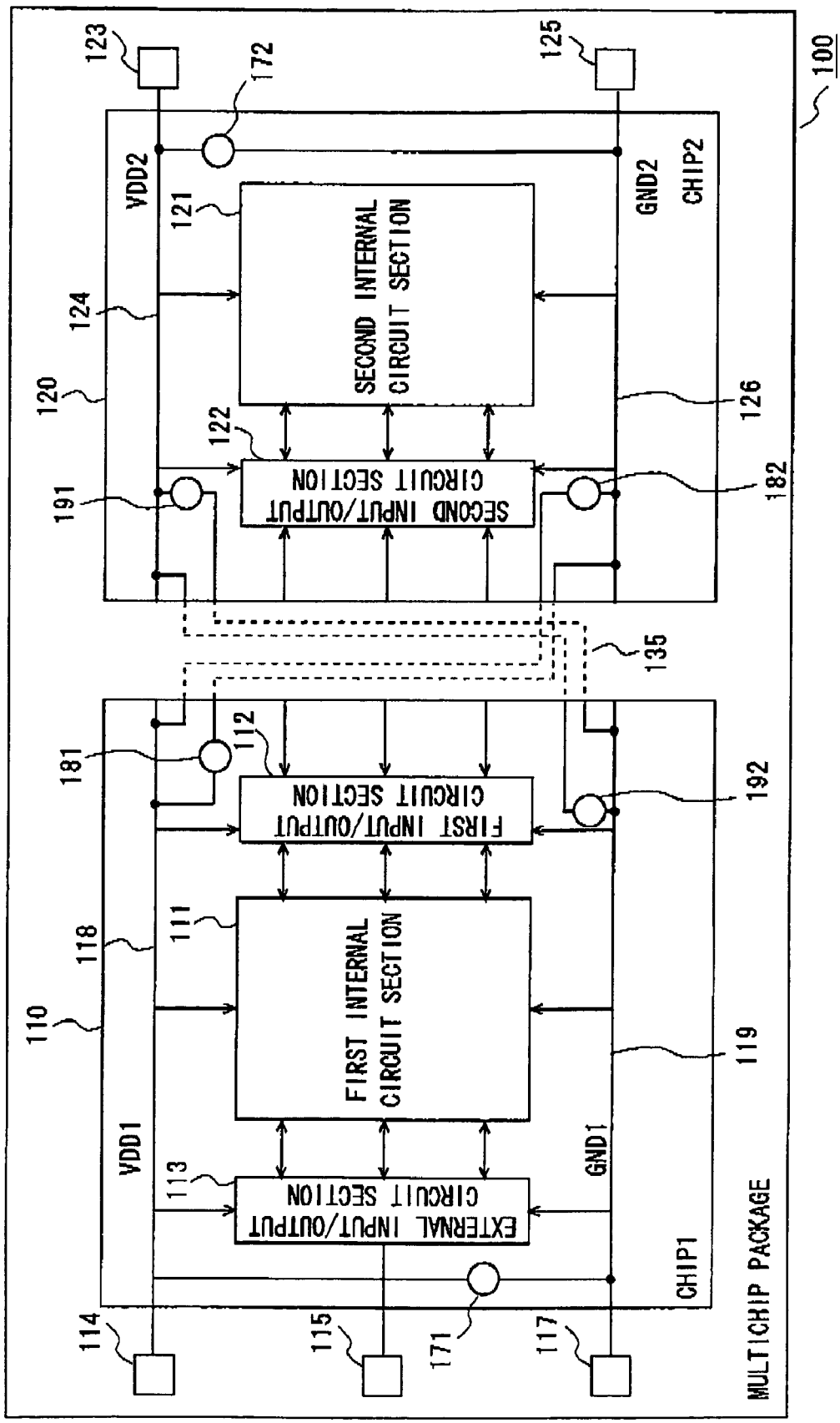
FIG. 2 is a block diagram showing the general circuit configuration of a multichip package according to the first embodiment.

In the semiconductor integrated circuit device 100 according to the present embodiment, preferably, the power supply lines and the ground lines are connected via ESD protection circuits. The connection between the power supply line and the ground line is formed either inside the same chip or between different chips. As shown in FIG. 2, within a single chip, the first power supply line 118 and the first ground line 119 are connected via the protection circuit 171. Similarly, the second power supply line 124 and the second ground line 126 are connected via the protection circuit 172. In the connection between a power supply line in one chip and a ground line in another chip, a protection circuit connected between the power supply line and the ground line is provided in each of the chips. The protection circuits are connected in substantially the same way as the protection circuits between ground lines or power supply lines. More specifically, a protection circuit 181 of the first chip and a protection circuit 182 of the second chip are connected between the first power supply line 118 of the first chip and the second ground line 126 of the second chip. The protection circuits 181 and 182 are connected in a parallel circuit configuration between these lines. Similarly, a protection circuit 191 of the first chip and a protection circuit 192 of the second chip are connected between the first ground line 119 of the first chip and the second power supply line 124 of the second chip. Preferably, the protection circuits 191 and 192 are connected in parallel circuit configuration between these lines. In FIG. 2, the other protection circuits are omitted from the illustration.

Figure 3A:
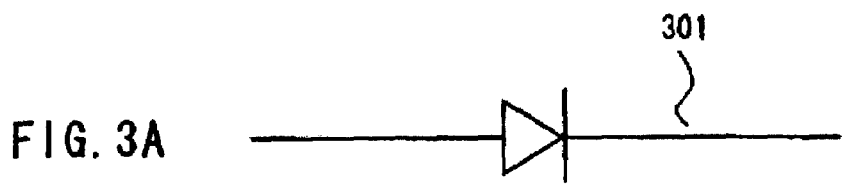
FIGS. 3A-3E are diagrams showing examples of the circuit configuration of protection circuits according to the first embodiment.
Figure 3B:
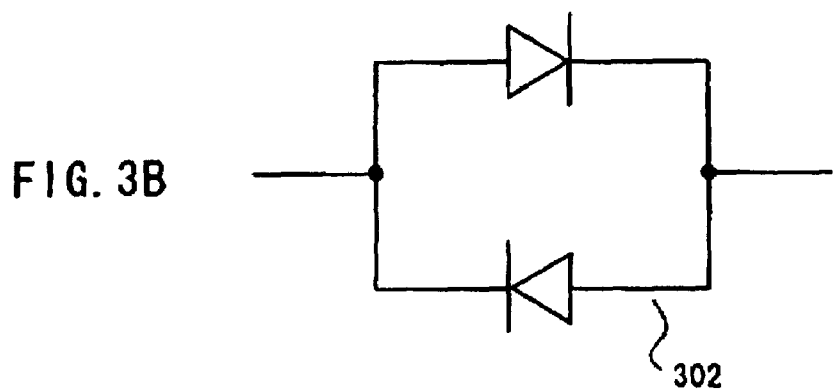

The ESD protection circuit may be composed by various commonly known circuits using transistors, diodes, or the like. FIG. 3A-3E show several examples of the configuration of an ESD protection circuit connected between two ground lines, for the purposes of illustration. FIG. 3A is a protection circuit constituted by a diode 301 only. If a prescribed forward bias voltage arises, then the diode passes current and the lines are clamped to the ground potential. If, on the other hand, an overvoltage arises in the reverse bias direction, then the diode 301 breaks down and connects electrically the two lines together, thus clamping the voltage between the lines to a prescribed voltage. FIG. 3B shows an exemplary protection circuit consisting of a bidirectional diode 302.

Figure 3C:
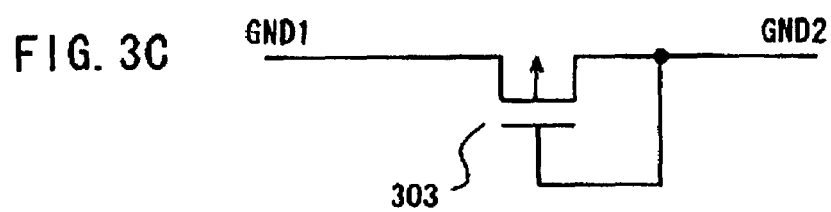

FIG. 3C shows an example of a protection circuit using an N type transistor 303. The same potential is applied to the gate and source of the transistor 303. If a positive overvoltage is applied in the direction from the source to the drain, then the drain diffusion layer of the N type transistor 303 is forward biased, the ESD current is discharged via the P type substrate (or P well), and the voltage between the lines is clamped to a clamp voltage.

If, on the other hand, a positive overvoltage is applied in the direction from the drain to the source, then the N type diffusion layer on the gate terminal side of the drain terminal of the N type transistor 303 breaks down, and a current flows into the P type substrate. If the potential of the P type substrate increases due to the current flowing into the P type substrate, then the diode formed by the N type diffusion layer of the source terminal and the P type substrate is biased in the forward direction, the parasitic NPN type bipolar transistor formed of the drain—the P type substrate—the source changes to an operational state (namely, a "snap back" operation), and the ESD current escapes. When the transistor is in a snap back operation state, the voltage between the lines is clamped to the clamp voltage that is equal to or lower than the breakdown voltage.

Figure 3D:
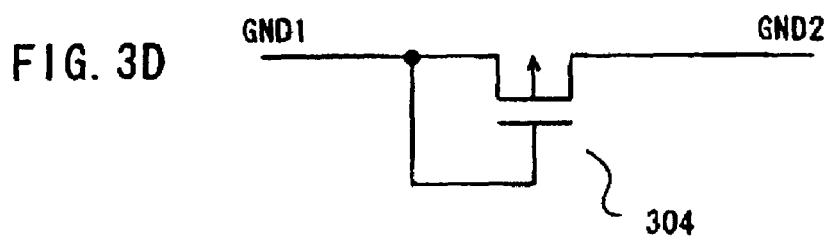
Figure 3E:
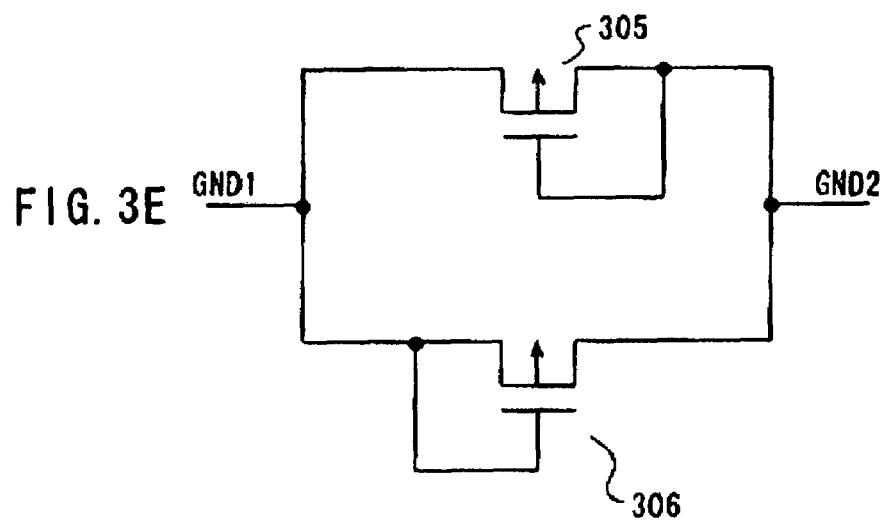

FIG. 3D is a protection circuit based on an N type transistor 304 having a bias direction that is the reverse of the N type transistor 303. It operates in the same way as the N type transistor 303. FIG. 3E shows one example of a protection circuit formed by connecting N type transistors 305 and 306 in a parallel configuration. Apart from the foregoing, the protection circuits may also be formed by various other configurations using P type transistors, bipolar transistors, or the like.

As described above, in the integrated semiconductor circuit device 100 according to the present embodiment, protective circuits between fixed-potential supply lines in different chips, specifically, protection circuits connecting the ground lines or protection circuits connecting the power supply lines, for instance, are formed respectively in the first chip 110 and the second chip 120. Thereby, it is possible to discharge ESD charge, and particularly ESD charge according to the CDM model, effectively, between different chips having physically separate substrates.

Figure 4A:
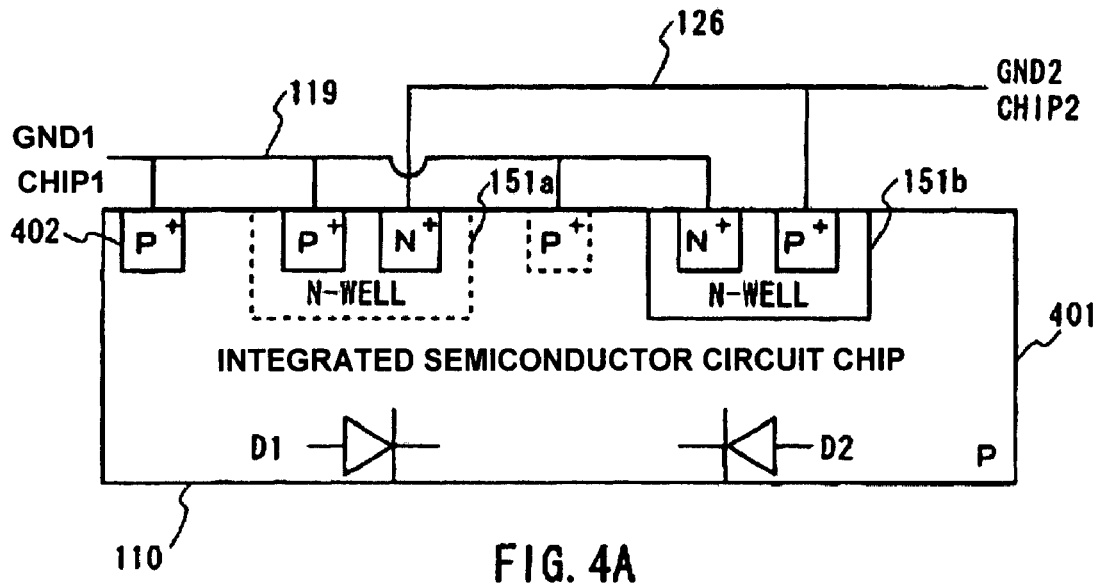
FIGS. 4A and 4B are diagrams describing the function of the protection circuit according to the first embodiment.

The function of the protection circuits according to the present embodiment during discharge of an ESD charge is now described with reference to FIG. 4A, 4B. The protection circuit connecting the first ground line 119 and the second ground line 126 will be described as an example. Furthermore, this description relates to a case where the first and second chips 110 and 120 have by P type substrates. In the case of an ESD discharge in a P type substrate, the main discharge path of the charge passes through the ground line.

Firstly, discharge of ESD charge in a case where a protection circuit is formed in one chip only will be described for the purpose of comparison with the present invention. FIG. 4A shows an example where protection circuits 151*a* and 151*b* are formed in the first chip 110. In this example, the protection circuits 151*a* and 151*b* are respectively constituted by one diode, formed by an N-well formed in the P type substrate 401, and P$^+$ and N$^+$ diffusion layers. An N-well does not have to be formed in the protection circuit 151*a*. The protection circuit 151*a* is forward biased when the potential GND1 (119) is higher than the GND2 (126), and the protection circuit 151*b* has a forward bias if the potential GND2 (126) is higher than GND1 (119). The P type substrate 401 of the first chip is supplied with the ground potential GND1, via the P$^+$ diffusion layer 402.

In the example described here, the device is charged positively and the charge is discharged from the terminal of chip 1 to a ground level. Since the charge is discharged via the terminal of chip 1, the potential of chip 1 (the potential of GND1) declines before that of chip 2. Therefore, in FIG. 4A, the protection circuit 151*b* is forward biased, and the protection circuit 151*a* is reverse biased. Consequently, in FIG. 4, the ESD charge accumulated in the second chip 120 flows from the second ground line 126 to the protection circuit 152, and it then flows further from the protection circuit 152 to the first ground line 119. The ESD charge from the second chip 120 never flows to GND1 (119) via the protection element 151*a*, in the initial period of the discharge.

In this way, the ESD charge from the second chip 120 concentrates in the protection circuit 151*b* formed on the first chip 110. Therefore, the discharge characteristics of the ESD charge passing from the second chip 120 to the first chip 110 via the ground line are determined by the capacity (size) of the protection circuit 151b. Accordingly, in the second chip 120, the ESD charge concentration or a local voltage shift occur, which may result in the element insulation film breakdown.

The protection circuit 151a, which is reverse biased in the direction from the second ground line 126 to the first ground line 119, can contribute to discharging the ESD charge by breaking down. However, since there is delay from the turn-on of the diode of the protection circuit 151b until the breakdown of the protection circuit 151a, the insulation film of the element can be damaged before the protection circuit 151a functions, and hence sufficient protection against ESD is not provided. If the device is charged negatively and the charge is discharged from the terminal of chip 2 to a ground level, then the potential of chip 2 rises before that of chip 1, and the bias direction during operation of the respective protection circuits 151a and 151b is the same as that described above.

Next, an example is described where the device is charged positively and the charge is discharged from the terminal of chip 2, to a ground level. Since the charge is discharged from the terminal of the chip 2, the potential of chip 2 declines before that of chip 1. Therefore, the protection circuit 151a operates with a forward bias. Since the protection circuit 151a is formed on a P type substrate 401, the ESD charge accumulated in the first chip 110 can be removed in a uniform fashion in the forward bias. Furthermore, since the removed charge is passed to the substrate potential of the second chip 120 via the second ground line 126, then the ESD charge can be discharged without ESD charge concentration. If the device is charged negatively and the charge is discharged from the terminal of chip 1 to a ground level, then the potential of chip 1 rises before that of chip 2, and therefore the bias direction during operation of the respective protection circuits 151a and 151b will be the same as that described above.

Figure 4B:
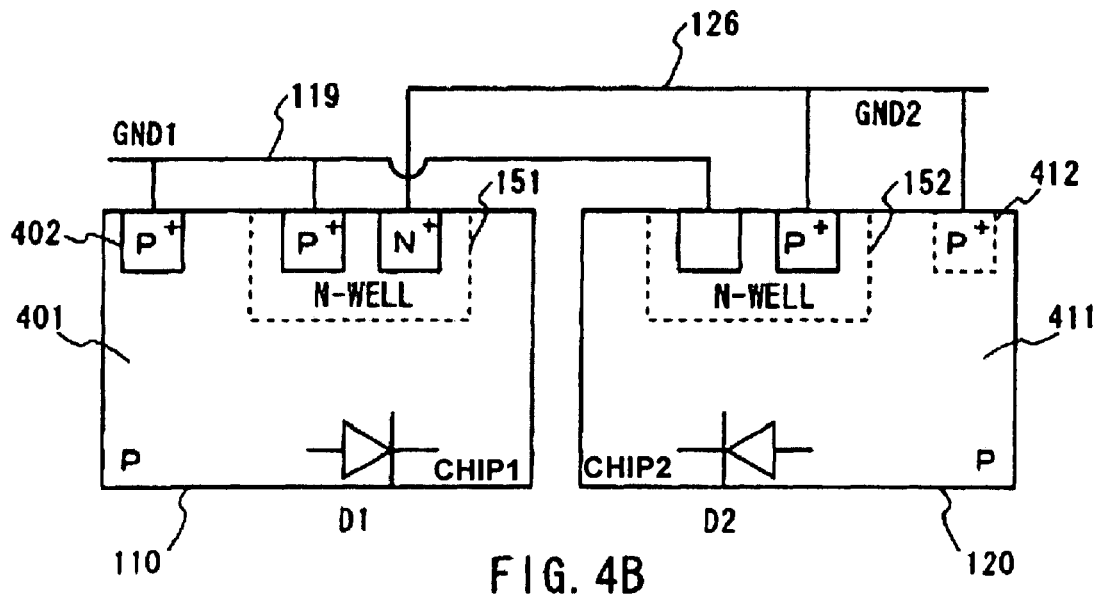

FIG. 4B shows a case where protection circuits connecting ground lines 119 and 126 are formed respectively in a first chip 110 and a second chip 120. A protection circuit 151 is formed in the first chip 110 and a protection circuit 152 is formed in the second chip 120. The protection circuits 151 and 152 are each constituted by a single diode. The protection circuit 151 is formed by an N-well formed in a P type substrate 401, and P$^+$ and N$^+$ diffusion layers.

The protection circuit 152 is formed by an N-well formed in the P type substrate 411 of the second chip 120, and P$^+$ and N$^+$ diffusion layers. A substrate potential GND2 is applied to the P type substrate 411 via the P$^+$ diffusion layer 412. N-wells do not have to be formed in the protection circuits 151 and 152. The protection circuit 151 is forward biased when the potential of GND1 (119) is higher than GND2 (126), and the protection circuit 152 is forward biased when the potential of GND2 (126) is higher than GND1 (119).

If the potential of the second chip 120 is higher than the potential of the first chip 110, so if the device is charged positively and the charge is discharged from the terminal of chip 1 to a ground level, or alternatively, if the device is charged negatively and the charge is discharged from the terminal of chip 2 to a ground level, then the protection circuit 152 operates in forward bias. Since the protection circuit 152 is formed on the P type substrate 411, then the ESD charge accumulated in the substrate can be removed in a more uniform manner. Furthermore, since the first ground line 119 connected to the protection circuit 152 is connected to the substrate potential GND1, the EDS charge can be discharged without ESD charge concentration. Consequently, it is possible effectively to prevent element damage due to ESD.

Similarly, if the potential of the first chip 110 is higher than the potential of the second chip 120, so if the device is charged positively and the charge is discharged from the terminal of chip 2 to a ground level, or alternatively, if the device is charged negatively and the charge is discharged from the terminal of chip 1 to a ground level, then the protection circuit 152 operates with a forward bias and the removed ESD charge flows directly to the substrate potential GND2 of the P type substrate 411 via the second ground line 126. As described above, since the protection circuit 151 is formed on the substrate 401, then the ESD charge can be removed from the first chip 110 in a uniform manner. Furthermore, since the ESD charge is passed to the substrate potential GND2 in the second chip 120, it is possible to limit the ESD charge concentration.

While the foregoing description related to an example where protection circuits are constituted by diodes, it is also possible, for example, to use an NMOSFET as shown in FIG. 3D as the protection circuit 151 of the first chip 110, and to use an NMOSFET as shown in FIG. 3C as the protection circuit 152 of the second chip 120. Alternatively, it is also possible to use the circuit configuration shown in FIG. 3E for the respective protection circuits 151 and 152.

While the foregoing description relates to a protection circuit between ground lines, it is also possible to adopt a similar approach to compose protection circuits for use between power supply lines, or between a power supply line and a ground line. Typically, a protection circuit for a power supply line has an opposite conductivity type to a protection circuit for a ground line. For example, if a MOSFET is used, then the protection circuit is constituted by a PMOSFET. Furthermore, if the chip is formed using an N type substrate, then the power supply potential is supplied to the N type substrate via an N$^+$ diffusion layer, and the power supply line functions principally to discharge ESD charge.

As described above, a protection circuit formed on a chip is designed in such a manner that the base potential side (namely, the ground potential side or the power supply potential side) of the protection element, such as a diode or transistor, assumes the substrate potential. According to the example described with reference to FIG. 4B, the ground potential side, which is the base potential side of the diodes 151 and 152, is the substrate potential. In a protection circuit consisting of a MOSFET, for example, the source of the MOSFET connected to the ground potential or the power supply potential assumes the substrate potential. Thereby, it is possible to remove the ESD charge from the chip on which the protection circuit is formed in a more uniform manner.

Second Embodiment

Figure 5:
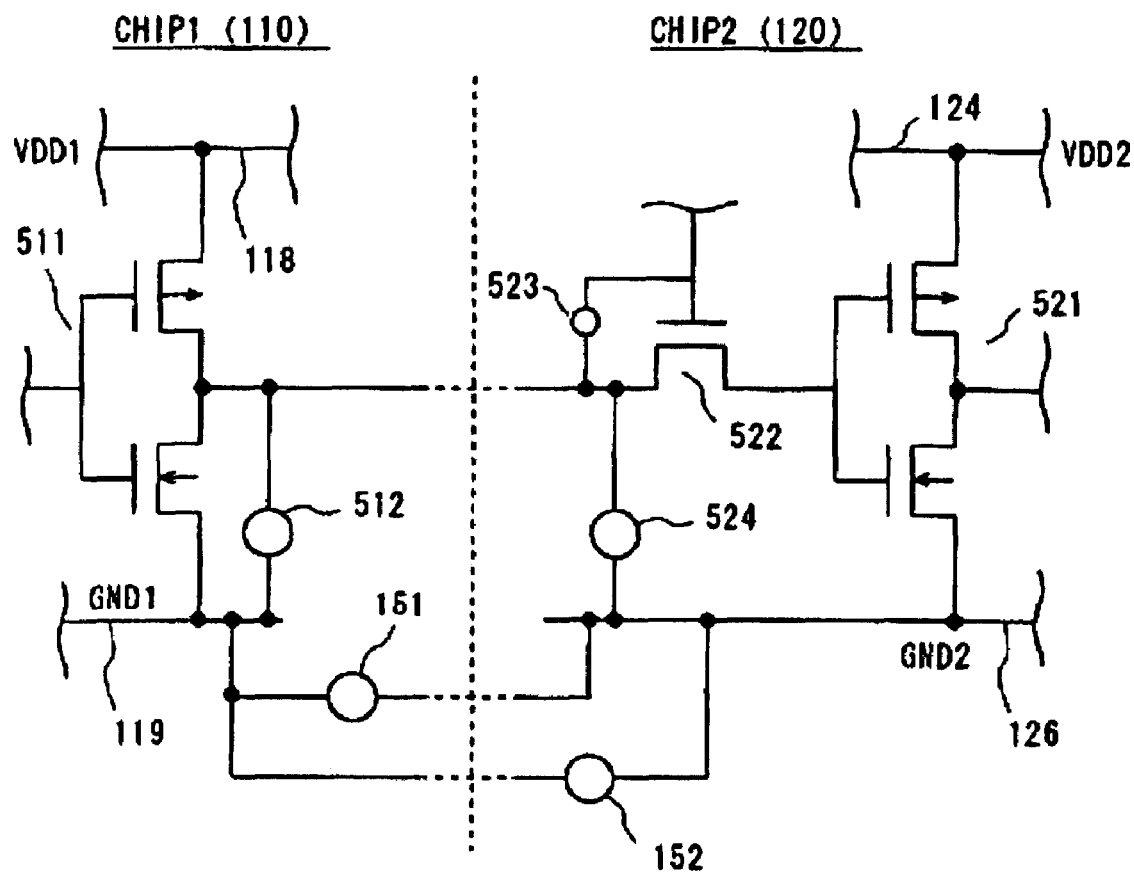
FIG. 5 shows an overview of a portion of the circuit configuration between a first input/output circuit section of a first chip and a second input/output circuit section of a section chip, according to a second embodiment of the present invention.

FIG. 5 shows a general view of a portion of the circuit configuration between the first input/output circuit section 112 of the first chip and the second input/output circuit section 122 of the second chip described with reference to FIG. 1. FIG. 5 shows an example of a circuit configuration between an output inverter 511 of the first input/output circuit section 112 and an input inverter 521 of the second input/output circuit section 122. As shown in FIG. 5, the second input/output circuit section 122 comprises a transfer transistor 522 connected between the output inverter 511 and the input inverter 521.

The diffusion layers (drain/source) of the transfer transistor 522 are connected respectively to the output inverter 511 and the input inverter 521, and the signal from the output inverter 511 is passed to the input inverter 521 via the diffusion layer of the transfer transistor 522. The transfer transistor 522 is in an normally-on state, or alternatively, it is able to control the passage of the signal on the basis of a control signal to the gate.

An ESD protection circuit 523 is formed between the diffusion layer which receives the input signal of the transfer transistor 522 and the gate of the transfer transistor 522. Furthermore, an ESD protection circuit 524 is also formed between the diffusion layer which receives the input signal of the transfer transistor 522 and the second ground line 126. In the first input/output circuit 112, an ESD protection circuit 512 is formed between the output line of the output inverter 511 and the first ground line 119. Protection circuits 151 and 152 are connected in parallel between the first and second ground lines, as described with reference to FIG. 2. The protection circuits 151 and 152 are formed respectively on the first chip substrate and the second chip substrate.

In the signal input/output circuit section according to the present embodiment, signals are received from different chips via the diffusion layer of the transfer transistor 522, and no signal is applied directly to the gate of the input/output circuit section. The transfer transistor 522 receives the input of ESD charge so that it is possible to reduce the effects of the ESD on the elements in the input section of the input/output circuit section. Furthermore, since a protection circuit 524 is formed between the input line of the input inverter and the second ground line 126, it is possible effectively to prevent the gate insulation film breakdown of the input inverter.

The protection circuit 523 formed between the diffusion layer and the gate of the transfer transistor 522 functions effectively to prevent electrostatic damage to the gate insulation film in the transfer transistor 522. The protection circuit 523 is able effectively to prevent damage to the gate insulation film of the transfer transistor 522 especially in cases where the ESD charge contained in the chip is discharged via the external pad according to the CDM model. Since the protection circuit 523 connected to the input/output signal line increases the capacitance, it is preferable that the protection circuit 523 is small in size.

Although not illustrated in the drawings, a protection circuit may be formed between the output line of the output inverter 511 and the first power supply line 118, or between the input line of the input inverter 521 and the second power supply line 124. Alternatively, a protection circuit may be formed between the input signal line and the second ground line 126, between the transfer transistor 522 and the input inverter 521. Furthermore, while the example described above relates to a circuit configuration of the input section of the second chip 120 which receives an input from the first chip 110, it is also possible effectively to prevent damage to circuit elements due to ESD, by adopting a similar configuration in the input section of the first chip 110 which receives an input from the second chip 120.

Third Embodiment

As the CDM model for ESD reveals, it is important that the ESD charge contained in the whole chip is discharged uniformly. If ESD charge is removed in a locally non-uniform manner, then this creates a voltage inside the chip and can lead to damage of the chip elements. Therefore, it is preferable to create a discharge path for the ESD charge that is uniform throughout the whole chip.

Figure 6:
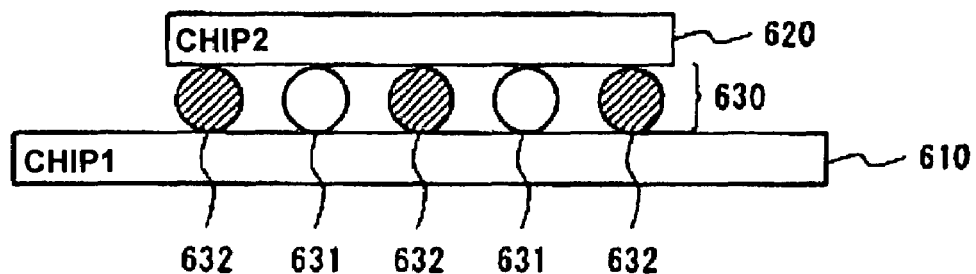
FIG. 6 is a diagram showing the configuration of connections between chips according to a third embodiment of the present invention.

FIG. 6 is a diagram showing the connections between chips according to the present embodiment. In FIG. 5, a lower, first chip 610 and an upper, second chip 620 are stacked together (in a "Chip On Chip" configuration), and are connected together via a plurality of connection bumps 630. The connection bumps 630 include both bumps used for transmitting signals, and bumps used for supplying a fixed electric potential, such as a ground potential or power supply potential.

FIG. 6 depicts signal transmission bumps 631 and substrate potential connection bumps 632 (where the substrate potential is the ground potential in the case of a P type substrate, or the power supply potential in the case of an N type substrate). A substrate potential connection bump 632 is formed at either end of a row (line) of signal transmission bumps 631. Furthermore, a substrate potential connection bump 632 is formed between the signal transmission bumps 631.

In the CDM model of ESD in which the ESD charge accumulated in chips is discharged via the external terminals of the package, the charge accumulated in one chip (for example, a second chip) flows into the other chip (for example, a first chip) via the connection bumps, and is then removed via an external terminal. If there is no power supply line or ground line connected between the chips, then the ESD charge is discharged via the signal transmission bumps. In this case, the load on the signal line (signal transmission bumps) increases, and the ESD charge thus tends to be removed from specific regions of the chip, resulting in variations in potential within the chip.

In the present embodiment, a plurality of substrate potential connection bumps 632 are provided between the chips, allowing ESD discharge via these substrate potential connection bumps 632. The substrate potential connection bumps 632 are connected via the protection circuits formed in either one or both of the chips. Furthermore, in order that the ESD charge can be removed in a more uniform manner throughout the chip, and in order to reduce the load on the signal transmission bumps 631, it is preferable that the substrate potential connection bumps 632 be disposed in a distributed fashion between the signal transmission bumps. For example, if the ground lines use a common terminal, then it is possible to connect the substrate potential connection bumps directly with lines (wiring), without interposing a protection circuit.

The substrate potential connection bumps are disposed so as to sandwich one or a plurality of signal transmission bumps. Preferably, the number of signal transmission bumps 631 between the substrate potential connection bumps 632 is uniform, and even more preferably, each substrate potential connection bump 632 is formed adjacently to each of the signal transmission bumps 631, as shown in FIG. 6. The substrate potential connection bumps 632 and the signal transmission bumps are placed alternately. In order that the ESD charge can be removed in a uniform manner, it is desirable that substrate potential connection bumps 632 are disposed respectively at both ends of the row of signal transmission bumps.

Figure 7:
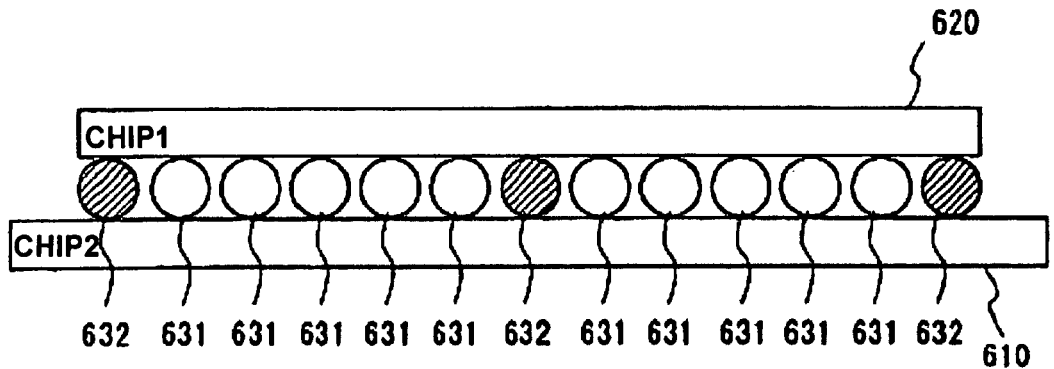
FIG. 7 is a diagram showing further desirable configuration of connections between chips according to the third embodiment.

FIG. 7 is a diagram showing another preferable layout of substrate potential connection bumps. In order to achieve uniform removal of the ESD charge from all parts of the chip, preferably, substrate potential connection bumps are disposed in a substantially uniform fashion over the opposing surfaces of the chips. In FIG. 7, substrate potential connection bumps 632 are disposed at substantially regular intervals in the left/right direction on the page of the illustrations, and an equal number of signal transmission bumps 631 are disposed between the substrate potential connection bumps 632. The substrate potential connection bumps 632 are positioned in such a manner that the distance between respective substrate potential connection bumps 632 is substantially even in at least one direction. Consequently, it is possible to achieve more uniform discharge of the ESD charge. If connection bumps are arranged in a two-dimensional fashion, then preferably, the substrate potential connection bumps 632 are positioned in a substantially uniform manner in both directions.

If substrate potential connection bumps are positioned in a substantially uniform manner, then it is not particularly necessary to provided signal transmission bumps between the substrate potential connection bumps. Though the present embodiment relates to an example of a multichip package comprising a plurality of chips which are stacked together, the layout of substrate potential connection bumps according to the present invention may also be applied to a multichip package which comprises a plurality of chips disposed in the same plane. In this case, the substrate potential connection bumps are positioned in a substantially uniform manner along the opposing edges of the respective chips.

Fourth Embodiment

According to the CDM model, the ESD charge is removed via one of the external terminals. If an ESD charge is discharged from one chip to another chip via substrate potential connection bumps, as in the foregoing embodiment, then problems arise in the chip to which the ESD charge is applied (the chip connected to the external terminal), in respect of the wiring length from the substrate potential connection bumps to the external terminal, and the wiring resistance (impedance).

Figure 8:
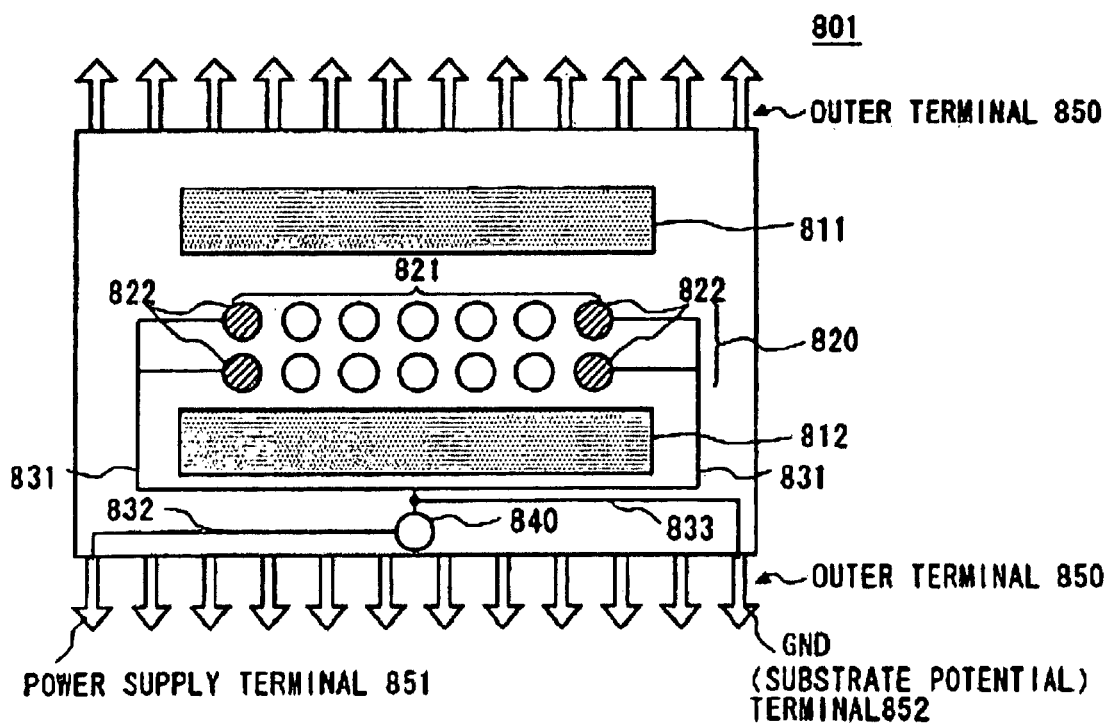
FIG. 8 shows the general configuration of a substrate potential line in a chip according to a fourth embodiment of the present invention.
Figure 9:
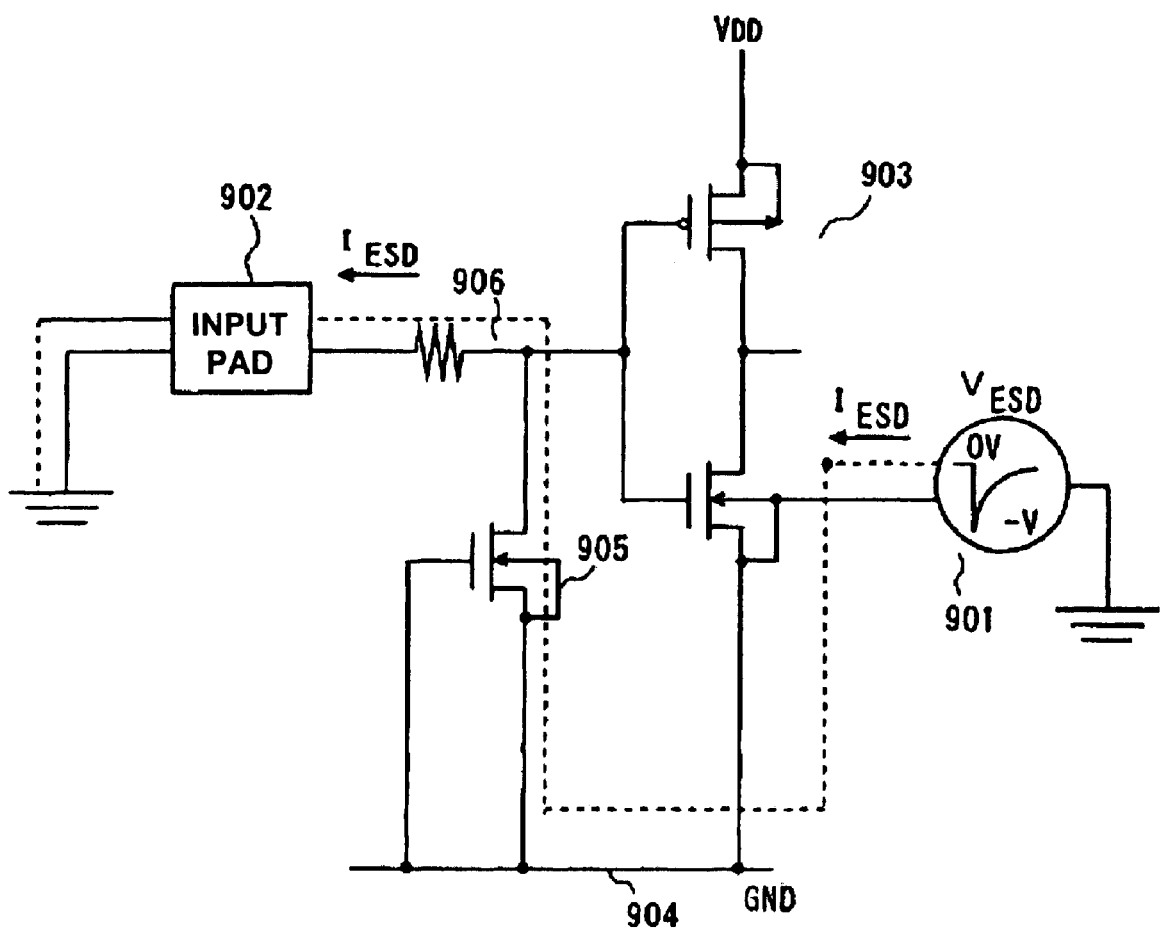
FIG. 9 is a diagram describing a CDM model of ESD, and a protection circuit, according to the related art.

FIG. 8 shows the substrate potential wiring structure in a chip 801 according to the present embodiment. The chip 801 corresponds to the lower chip 610 in FIG. 7, for example. The chip 801 is connected to a plurality of external terminals 850, and ESD charge from another chip flows into the chip 801 via substrate potential connection bumps, or the like, and is discharged via any of the external terminals. In FIG. 8, a P type substrate is shown as an example, and the substrate potential is a ground potential. As shown in FIG. 8, the chip 801 comprises circuit patterns 811 and 812, and a plurality of connection bumps 820.

The plurality of connection bumps 820 comprise a plurality of signal transmission bumps 821 and a plurality of substrate potential connection bumps 822. In this example, two rows of signal transmission bumps are formed and substrate potential connection bumps 822 are formed at either end of each row. As described above, it is of course also possible to add substrate potential connection bumps between any of the signal transmission bumps 821. ESD charge removed from another chip via the substrate potential connection bumps 822 is discharged from the external terminal 850 by passing via the substrate potential line 831.

In order to achieve uniform discharge of the charge from the respective substrate potential connection bumps 822, difference in wiring resistance between the substrate potential connection bumps 822 and the external terminals 850 must be little, and preferably, the wiring resistances are substantially the same. As shown in the diagram, a line is provided from approximately the central point of the substrate potential line 831, in the left/right direction, to the GND terminal 852. If there is a large difference in the wiring resistances, then there will be a difference in the amount of ESD charge discharged via each substrate potential connection bump 822, and this may lead local variation in the electric potential which in turn causes element damage.

Referring to FIG. 8, the substrate potential line (ground line) 831 and the power supply line 832 are connected via a protection circuit 840, as described previously with respect to FIG. 2. The substrate potential line 831 from the substrate potential connection bumps 822 is connected to the protection circuit 840 and the protection circuit 840 is connected to a power supply terminal via the power supply line 832. Taking account of the discharge path of the ESD between the substrate potential connection bumps 822 and the power supply terminal 851, it is necessary to locate the protection circuit 840 at a position which reduces the difference in wiring resistance from the substrate potential connection bumps 822 to the power supply terminal 851, and preferably, the protection circuit 840 is formed in such a manner that the wiring resistance is substantially the same for each substrate potential connection bump 822.

It is possible to achieve uniform wiring resistance by forming the protection circuit 840 in an approximately symmetrical position with respect to the layout of the plurality of substrate potential connection bumps 822. In FIG. 8, the protection circuit 840 is disposed in an approximately central position with respect to the substrate potential connection bumps 822 at either end of the row of signal transmission bumps 821. Furthermore, by adopting this configuration, it is possible readily to constitute a circuit in which the wiring resistances from the respective substrate potential connection bumps 822 to the power supply terminal 851 are substantially the same, and it is also possible effectively to prevent electrostatic damage to the circuit elements.

If substrate potential connection bumps 822 are formed on either end of a row of signal transmission bumps 821, as illustrated in FIG. 8, then in order to prevent element damage during discharge of the ESD charge, it is important to adopt a circuit configuration in which the wiring resistance to the power supply terminal 851 is substantially the same from the substrate potential connection bumps 822 at either end. Since there is a large interval between the substrate potential connection bumps 822 located at either end, a significant difference in wiring resistance is liable to occur with an inappropriate design.

Alternatively, by adopting a circuit configuration whereby the wiring resistances from the substrate potential connection bumps 822 at either end are substantially the same, it becomes easier to achieve a design which reduces the difference in wiring resistance with respect to other substrate potential connection bumps (not illustrated). Therefore, variation in the potential throughout the whole chip during the discharge process can be suppressed effectively. This point also applies to the following description, and although only one protection circuit 840 is described in the foregoing example, it is also possible to form a plurality of protection circuits.

If charge is discharged from the input/output terminal (unnumbered) of the chip 801, then a protection element is provided between the input/output terminals and GND or the power supply line (not illustrated), and the charge is discharged from the input/output terminal, passing through this protection element. The protection element is connected to the GND potential line 833 or the power supply potential line 832. If this input/output terminal protection element is connected to the GND potential line 831, then non-uniformity arises in the removal of charge (the movement of charge) from chip 2, depending on the position of the input/output terminal.

Taking account of the discharge path of the ESD between the substrate potential connection bumps 822 and the ground terminal 852, the wiring is formed so as to reduce the difference in wiring resistance from the respective substrate potential connection bumps 822 to the ground terminal 852, and preferably, a circuit configuration is adopted whereby the wiring resistance is substantially the same for each of the substrate potential connection bumps 822. In FIG. 8, the substrate potential line 831 from the substrate potential connection bumps 822 is connected to the ground terminal 852 via a node. The wiring is formed in such a manner that the wiring resistance to the ground terminal 852 is substantially the same from each of the substrate potential connection bumps 822. Consequently, it is possible effectively to prevent electrostatic damage to the element caused by voltage occurring as a result of differences in the amount of ESD charge discharged.

It is apparent that the present invention is not limited to the above embodiments, that may be modified and changed without departing from the scope and spirit of the invention.

What is claimed is:

1. A semiconductor device comprising:
a first semiconductor chip in a package;
a second semiconductor chip in the package;
a first potential supply line formed in the first semiconductor chip;
a second potential supply line formed in the second semiconductor chip;
a first protection circuit formed in the first semiconductor chip and connecting the first potential supply line and the second potential supply line;
a second protection circuit formed in the second semiconductor chip and connecting the first potential supply line and the second potential supply line;
a chip-to-chip connection part;
a third potential supply line formed in the second semiconductor chip and connected to the first potential supply line through the chip-to-chip connection part;
a fourth potential supply line formed in the first semiconductor chip and connected to the second potential supply line through the chip-to-chip connection part;
a third protection circuit formed in the first semiconductor chip and connected between the first potential supply line and the fourth potential supply line; and
a fourth protection circuit formed in the second semiconductor circuit chip and connected between the second potential supply line and the third potential supply line.

2. The semiconductor device of claim 1, wherein a supply potential of the first potential supply line is a substrate potential of the first semiconductor chip, and a supply potential of the second potential supply line is a substrate potential of the second semiconductor chip.

3. The semiconductor device of claim 1, wherein
the first and the second semiconductor chips have a P type substrate respectively,
the first potential supply line is a first ground line supplying a ground potential in the first semiconductor chip, and
the second potential supply line is a second ground line supplying a ground potential in the second semiconductor chip.

4. The semiconductor device of claim 1, wherein
the first protection circuit includes a protection element,
the first potential supply line supplies a ground potential, and
the protection element is formed on the first potential supply line in such a manner that operating forward bias direction of the protection element is from the first potential supply line toward the second potential supply line.

5. The semiconductor device of claim 1, wherein
the first semiconductor chip comprises an output circuit, and
the second semiconductor chip comprises an input circuit receiving a signal from the output circuit through a transfer gate.

6. The semiconductor device of claim 1, wherein
the first protection circuit comprises a first protection element,
the second protection circuit comprises a second protection element, and
an operating forward bias direction of the first protection element is opposite to an operating forward bias direction of the second protection element.

7. The semiconductor device of claim 1, wherein
the first and the second protection circuit have at least one of a diode and a MOS-FET.

8. The semiconductor circuit device comprising:
a first semiconductor chip connected to an external terminal;
a second semiconductor chip; and
a plurality of connection terminals connecting the first semiconductor chip and the second semiconductor chip, comprising a first and a second substrate potential connection terminals, line length from the external terminal to the first substrate potential connection terminal being substantially the same with line length from the external terminal to the second substrate potential connection terminal,
wherein
the first substrate potential connection terminal is connected to the external terminal through a protection circuit, and
the second substrate potential connection terminal is connected to the external terminal through a protection circuit, and
wherein the protection circuit connected to the first substrate potential connection terminal and the protection circuit connected to the second substrate potential connection terminal are one and the same.

9. The semiconductor device of claim 8, wherein a substrate potential is supplied via the external terminal.

10. A semiconductor device comprising:
a chip-to-chip connection part;
a first semiconductor chip;
a second semiconductor chip;
a first potential supply line formed in the first semiconductor chip and supplying a first voltage potential;
a second potential supply line formed in the second semiconductor chip and supplying a second voltage potential different from the first voltage potential;
a third potential supply line formed in the second semiconductor chip and connected to the first potential supply line through the chip-to-chip connection part and supplying a third voltage potential different from the first and second voltage potentials;
a fourth potential supply line formed in the first semiconductor chip and connected to the second potential supply line through the chip-to-chip connection part and supplying a fourth voltage potential different from the first, second and third voltage potentials;
a first protection circuit formed in the first semiconductor chip and connected between the first potential supply line and the fourth potential supply line; and
a second protection circuit formed in the second semiconductor chip and connected between the second potential supply line and the third potential supply line.

11. The semiconductor device of claim 10, wherein the first and the second semiconductor chips have a P type substrate respectively,
the first potential supply line is a first ground line supplying a ground potential in the first semiconductor chip, and
the second potential supply line is a second ground line supplying a ground potential in the second semiconductor chip.

12. The semiconductor device of claim 10, wherein
the first protection circuit includes a protection element, the first potential supply line supplies a ground potential, and the protection element is formed on the first potential supply line in such a manner that operating forward bias direction of the protection element is from the first potential supply line toward the second potential supply line.

13. The semiconductor device of claim 10, wherein the first semiconductor chip comprises an output circuit, and the second semiconductor chip comprises an input circuit receiving a signal from the output circuit through a transfer gate.

14. The semiconductor device of claim 10, wherein the first and the second protection circuit have at least one of a diode and a MOS-FET.

15. The semiconductor device of claim 10, wherein a supply potential of the first potential supply line is a substrate potential of the first semiconductor chip, and a supply potential of the second potential supply line is a substrate potential of the second semiconductor chip.

16. A semiconductor device comprising:

a package having a plurality of external terminals to form an external interface of said device;

a first semiconductor chip associated with said package, said first chip having a first line formed thereon;

a second semiconductor chip associated with said package, said second chip having a second line formed thereon;

a first protection circuit integrated in said first chip and having one end thereof coupled to one end of said first line;

a second protection circuit integrated in said second chip and having one end thereof coupled to one end of said second line, another end of said second protection circuit being coupled to said one end of said first line, another end of said first protection circuit being coupled to said one end of said second line, each of another end of said first line and another end of said second line being coupled to a respective one of said external terminals.

17. A device of claim 16, wherein said another end of said first line is coupled to said one of said external terminals to form therebetween an electrical path, said one end of said first line not being located in a length of said electrical path.

18. A device of claim 17, wherein said another end of said second line is coupled to said respective one of said external terminals to form therebetween another electrical path, said one end of said second line not being located in a length of said another electrical path.

19. A device of claim 17, wherein said another end of said second first line and said another end of said second line are respectively coupled to different ones of said external terminals.

20. A device of claim 17, further comprising:

an internal circuit integrated in said first chip;

wherein said first line supplies a power voltage to said internal circuit whereas said another end of said first protection circuit does not supply a voltage to said internal circuit.

\* \* \* \* \*